United States Patent [19]
Ajit et al.

[11] Patent Number: 5,474,946
[45] Date of Patent: Dec. 12, 1995

[54] REDUCED MASK PROCESS FOR MANUFACTURE OF MOS GATED DEVICES

[75] Inventors: Janardhanan S. Ajit, Redondo Beach; Daniel M. Kinzer, El Segundo, both of Calif.

[73] Assignee: International Rectifier Corporation, El Segundo, Calif.

[21] Appl. No.: 390,099

[22] Filed: Feb. 17, 1995

[51] Int. Cl.[6] ................................. H01L 21/265
[52] U.S. Cl. ................... 437/41; 437/27; 437/29; 437/148; 437/931; 148/DIG. 126
[58] Field of Search .............. 437/154, 147–150, 437/53, 931, 27–29, 37, 40–41; 148/DIG. 126, DIG. 10–11; 257/124–125

[56] References Cited

U.S. PATENT DOCUMENTS

| | | | |
|---|---|---|---|
| 4,902,636 | 2/1990 | Akiyama et al. | 437/45 |
| 5,024,962 | 6/1991 | Murray et al. | 437/40 |
| 5,030,581 | 7/1991 | Yakushiji et al. | 437/27 |

*Primary Examiner*—Olik Chaudhuri
*Assistant Examiner*—H. Jey Tsai
*Attorney, Agent, or Firm*—Ostrolenk, Faber, Gerb & Soffen

[57] ABSTRACT

A process for forming a MOS gated device in which an oxide layer is patterned to have adjacent thick and thin oxide layers atop a silicon surface. Polysilicon is then patterned atop the oxide layer with a critical alignment step to the thin oxide layers in the process. Boron is implanted through both the thick and thin regions of the oxide which are exposed by the polysilicon mask to form P type base regions and P type guard rings in the silicon. Arsenic is thereafter implanted at an energy at which arsenic atoms penetrate only the thin oxide exposed by the polysilicon to form self-aligned source regions in the base regions previously formed. A contact opening mask which is critically aligned to the polysilicon mask forms openings for making contact to the silicon. The device is completed using non-critical alignment masking steps.

15 Claims, 4 Drawing Sheets

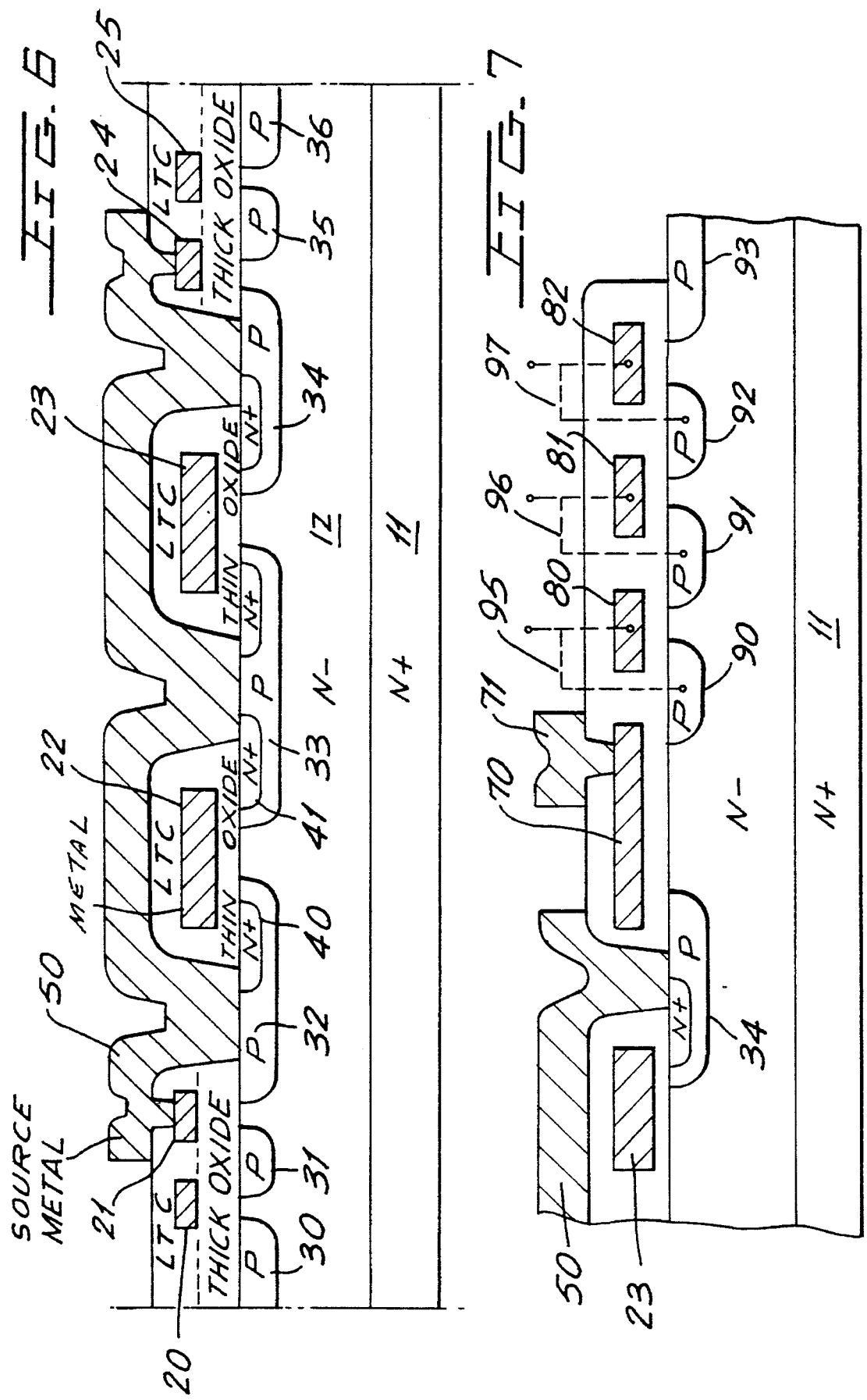

REDUCED MASK PROCESS FOR MANUFACTURE OF MOS GATED DEVICES

RELATED APPLICATIONS

This application is related to application Ser. No. 08/299,533 filed Sep. 1, 1994, entitled PROCESS FOR MANUFACTURE OF MOS GATED DEVICE WITH REDUCED MASK COUNT, which is assigned to the assignee of the present invention.

BACKGROUND OF THE INVENTION

This invention relates to MOS gated devices, and more specifically relates to a novel process which exploits the different implantation ranges of certain N and P impurities to produce a junction pattern with fewer mask steps and only two critical mask alignments.

MOS gated devices, such as power MOSFETs, Insulated Gate Bipolar Transistors (IGBTs) and MOS gated thyristors are well known. The process used for the manufacture of these devices employs a sequence of masking steps in which many of the masks must be carefully and critically aligned with respect to one another. Each mask layer in a process increases manufacturing expense, and each mask step introduces a new possible source of defects. Moreover, the requirement of aligning several masks with critical accuracy relative to one another also adds manufacturing costs and introduces the possibility of additional manufacturing defects.

A process for manufacturing such devices which employs a reduced number of masks, and a reduced number of critical alignments between masks is desirable since it reduces wafer handling, potential defects and the cost of the individual chips in a wafer.

SUMMARY OF THE INVENTION

In accordance with the present invention, an oxide layer, having adjacent thin and thick regions is formed in a first masking step. A critically aligned patterned polysilicon layer is formed in a second masking step to accurately deposit polysilicon layers in predefined regions of the thin oxide, which becomes the gate oxide of a MOS gated device. A first species is then implanted through both the thin and the thick oxide exposed by the patterned polysilicon so as to form spaced base regions. A second species is next implanted at an energy sufficient to penetrate only the thinner oxide regions exposed between the edges of the polysilicon and the edges of the thicker oxide, but not the exposed thicker oxide, to form source regions within the bases with critical alignment. After the base regions and source regions are formed as described above, a mask step which defines contact windows in a low temperature oxide which covers the wafer surface is carried out. This mask is critically aligned with the polysilicon mask.

Note that this process has only two critical alignment masking steps as described above. The first is the alignment of the polysilicon mask to the prior mask which defined the thin and thick oxide regions. The second is the alignment of the contact window mask to the prior polysilicon mask.

A plurality of series-connected PMOS devices can be formed during the process steps described above to form a termination surrounding the device active area.

More specifically, for fabricating semiconductor devices, masks are used to form each of the different layers necessary for the functioning of the semiconductor devices. In the present invention, in effect, a single mask defines two layers. Using a vertical N channel power MOSFET as an example, the vertical N channel power MOSFET consists of basically two diffused regions: a shallow $N^+$ region and a deeper P body region. The range of boron (a P type dopant) in silicon dioxide is about five times that of arsenic (an N type dopant). An oxide thickness of 3000 Å can be penetrated by boron implantation of greater than about 80 KeV while it would mask against arsenic implantation of less than about 120 KeV. In accordance with the invention, this property is used to define both the P body and $N^+$ regions using a single oxide layer and polysilicon mask (eliminating the source mask). The device process then employs a further critical mask for defining all contact regions. This mask and the mask for defining the polysilicon pattern are the only two masks which require a critical, or high-accuracy alignment.

Other features and advantages of the present invention will become apparent from the following description of the invention which refers to the accompanying drawings.

BRIEF DESCRIPTION OF THE DRAWINGS

FIG. 6 shows the wafer portion of FIG. 5, following the deposition of the source metal, and the patterning of the source metal by a non-critical mask step.

FIG. 7 shows the use of series-connected PMOS devices as a termination for the device disclosed.

DETAILED DESCRIPTION OF THE INVENTION

Figure 1:
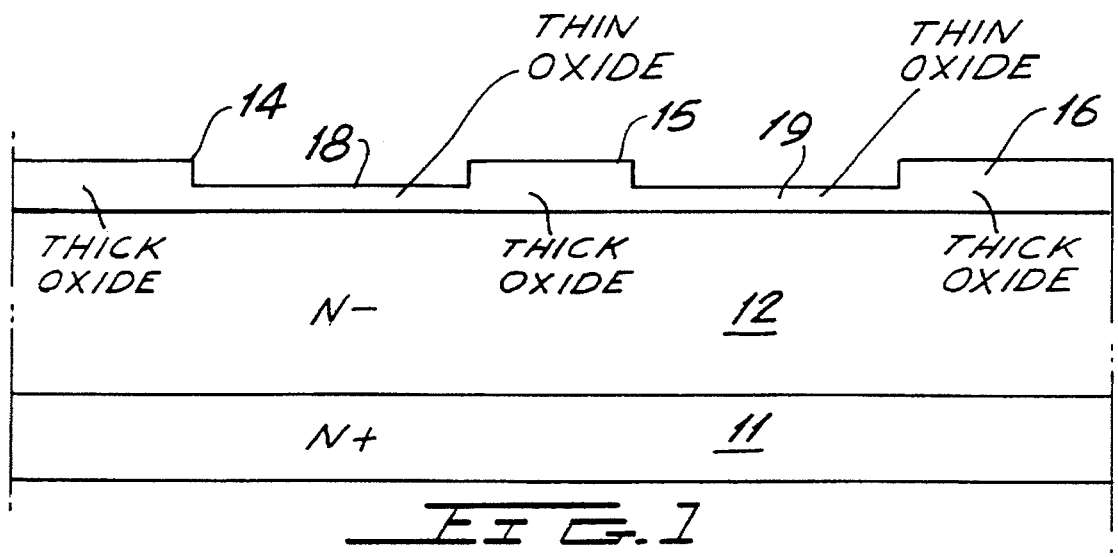
FIG. 1 is a cross-sectional view of a small portion of a wafer after a first masking step and the definition of a pattern of thin and thick oxides.

Referring first to FIG. 1, there is shown a small portion of a monocrystalline wafer 10 having a relatively thick substrate portion 11 and a relatively thin epitaxially deposited portion 12. Regions 11 and 12 are shown as N type for the manufacture of an N channel device, but the conductivity types can be reversed to form a P channel device.

The present invention can also be used in connection with any desired device topology, such as a cellular topology, as disclosed in U.S. Pat. No. 5,008,725 or interdigitated topology, as shown in U.S. Pat. No. 4,376,286. Further, the invention can be used for the manufacture of any desired type of MOS gated device, such as power MOSFETs, IGBTs, MOS gated thyristors, and the like.

In the embodiment disclosed, an N channel power MOSFET of interdigitated topology is disclosed. In FIG. 1, a thick oxide layer, of thickness of about 3000 Å, is first grown atop the epitaxial layer 12. This oxide is then coated with a photoresist, the resist is patterned with a first mask pattern (not shown) and the thick oxide is etched forming thick, spaced, parallel strips 14, 15 and 16. Any number of strips 14, 15 and 16 can be used and they may extend around predetermined parallel paths. These regions may also have the shapes of spaced closed polygons.

Thin oxide strips 18 and 19 are then regrown on the exposed silicon surface to a thickness, for example, of 500 Å. These regions 18 and 19 are between thick regions 14–15 and 15–16, respectively. Portions of regions 18 and 19 will ultimately define the gate oxide for the device. The thick and thin regions can have other thicknesses than 3000 Å and 500 Å respectively, and their thicknesses are selected based on the desired gate characteristics, the ion species to be implanted to form P and N regions and the implant energy to be used.

Figure 2:
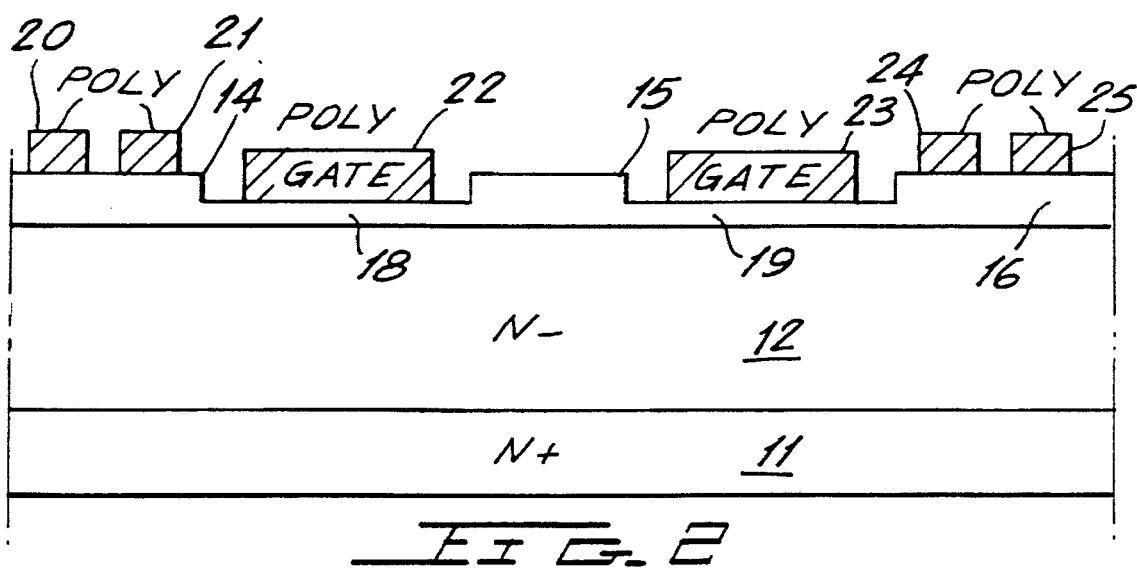
FIG. 2 shows the wafer portion of FIG. 1, following a second mask used to pattern a polysilicon layer with a critical alignment to the first mask.

Thereafter, a layer of polysilicon is grown atop the surface of the device as shown in FIG. 2 and a photoresist is deposited thereon and is patterned by a second mask which is critically, (very accurately) aligned to the first mask which defined the location of the thick and thin regions 14, 15, 16, 18 and 19. The polysilicon is then etched, leaving strips 20, 21, 22, 23, 24 and 25 in place. Strips 22 and 23 are gates for the MOSgated devices being made and are accurately located centrally atop thin gate oxide regions 18 and 19, defining gaps approximately 2 microns from the sides of each of the adjacent thick oxide regions and 5 microns wide.

Polysilicon strips 20–21 and 24–25 are spaced apart by a gap of about 3 microns. Strips 20, 21, 24 and 25 and other adjacent strips, not described will define guard rings and diffusions, as will be shown later.

Figure 3:
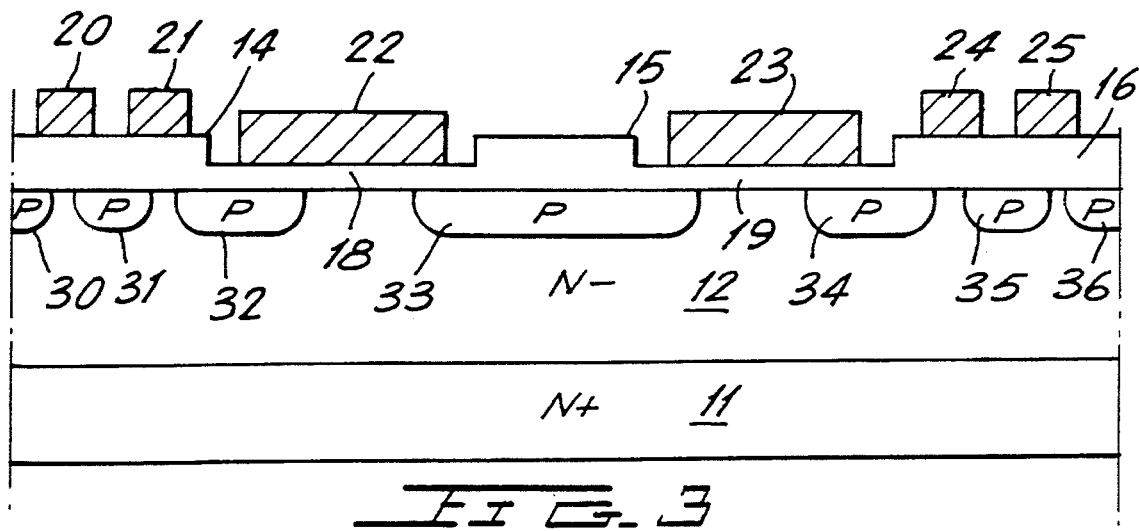
FIG. 3 shows the wafer portion of FIG. 2 after an implant of a base region through exposed thick and thin oxide regions and the drive of the device base regions.

Thereafter, as shown in FIG. 3, a boron implant is carried out, using the polysilicon strips 20 to 25 as a mask, at an energy sufficient to penetrate both the thin and thick exposed oxide layers 14, 15, 16, 18 and 19. For example, boron implantation at an energy of about 80 KeV or higher can be used at a dose of $7E13$ $cm^{-2}$. Species other than boron could alternately be selected. The energy used for the implant is determined, in part, by the thickness of the thick oxide. This implant is followed by a drive at 1175° C. shown in FIG. 3 for 30 minutes to form the P type regions 30 to 36. Note that regions 30, 31, 35 and 36 are sections through guard rings which terminate active base regions 32 and 34.

Figure 4:
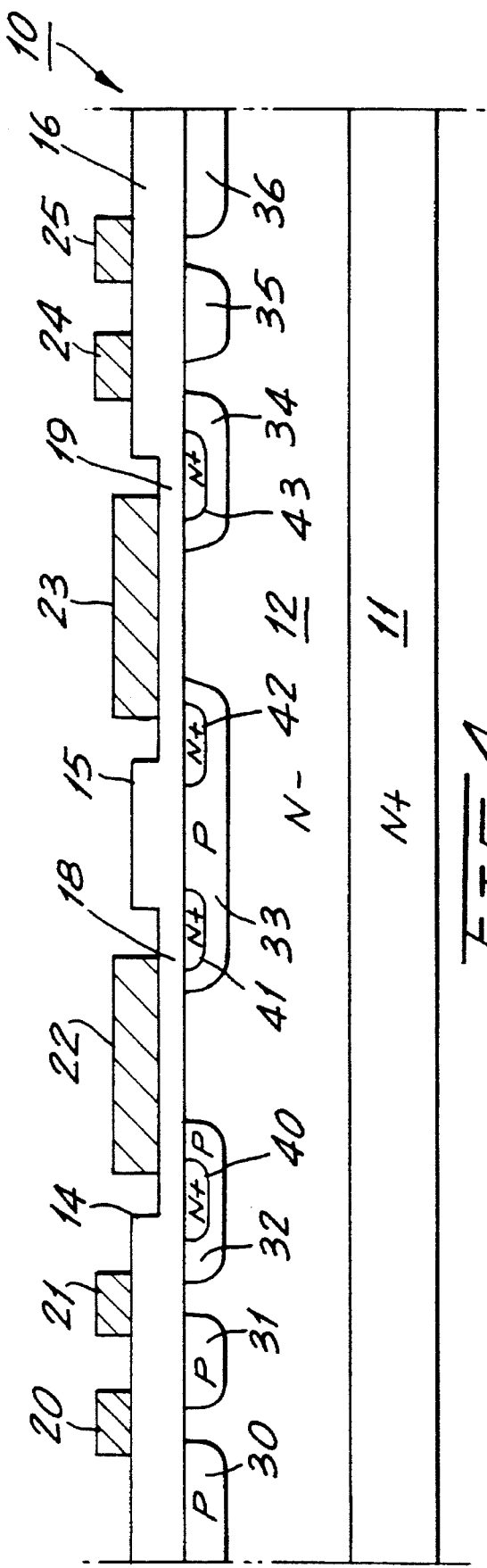
FIG. 4 shows the wafer portion of FIG. 3 following the implant of the source region through the exposed thin oxide only, to form source regions and the anneal of those regions.

Thereafter, and as shown in FIG. 4, arsenic is implanted into the silicon surface, using the same polysilicon strips 20 to 25 as masks. The energy selected for the arsenic implant (or any other species selected) is sufficient to penetrate the thin exposed gate oxide layers 18 and 19, but it is blocked by the thicker exposed oxide regions. Arsenic, at an energy of 80 KeV and a dose of 1E16, reaches the underlying silicon and forms $N^+$ source strips 40, 41, 42 and 43 in the bases 32, 33 and 34.

Figure 5:
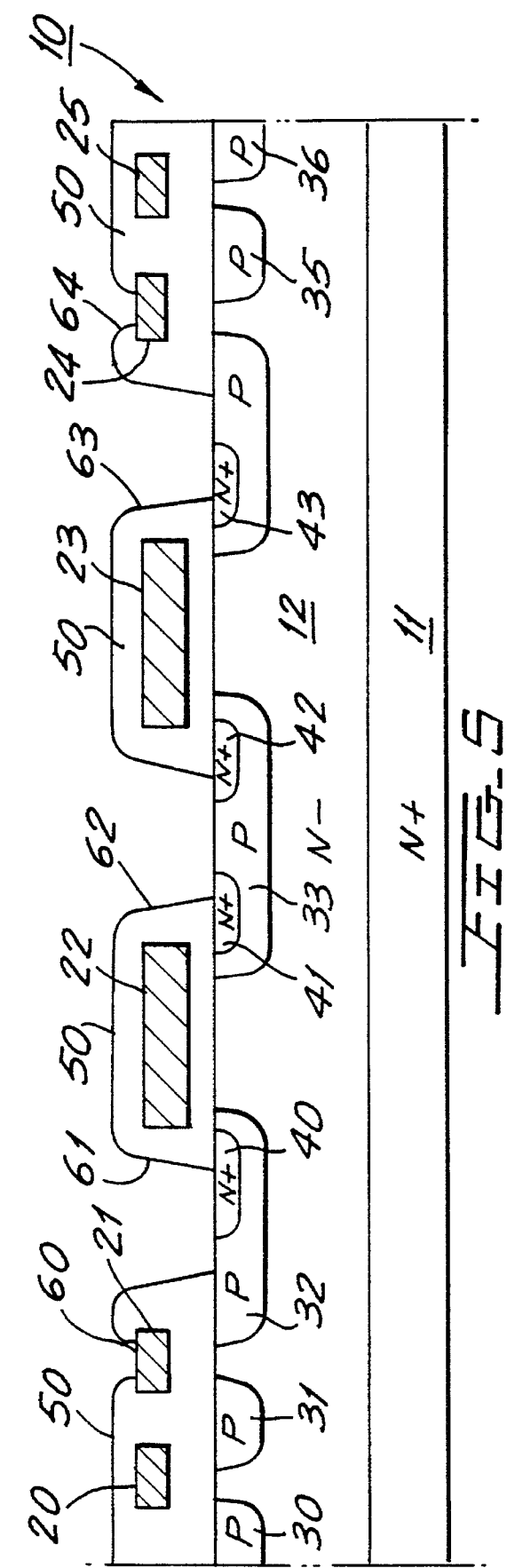
FIG. 5 shows the wafer portion of FIG. 5 following the deposition of an oxide interlayer and the formation of contact windows by a mask which is aligned with critical accuracy to the polysilicon mask.

As next shown in FIG. 5, a layer of low temperature oxide (LTO) 50 is deposited atop the wafer of FIG. 4 to a thickness of about 7000 Å. The LTO is then patterned in a second critical masking step (relative to the polysilicon mask) to form contact windows 60 to 64. Windows 60 and 64 expose the surfaces of rings 21 and 24, windows 61 and 63 expose the surfaces of P regions 32 and 34, respectively, and sources 40 and 43, and window 62 exposes the surfaces of base 33 and sources 41 and 42.

Note that if the topology of the device of FIG. 5 is chosen to be ring-shaped, base 33 may have a polygonal shape, with sources 41 and 42 being sections through a single annular source, and with bases 32 and 34 being sections through a single base which is concentric with base 33, and with rings 31 and 35 being sections through a single ring also concentric with base 33.

Thereafter, and as shown in FIG. 6, a source metal 50 is deposited atop the surface of FIG. 5 to make contact to rings 21 and 24 which terminate the active area of the device and to base regions 32, 33 and 34 and their sources 40, 41–42 and 43, respectively. Thereafter, a metal pattern is defined, using a fourth, but non-critical mask step.

FIG. 7 shows the use of a plurality of series connected PMOS devices which can be used to terminate the active area of the device of FIG. 6. These rings are formed during the same steps which are used to form the active area of the devices.

Thus, in FIG. 7, a polysilicon field plate 70 which may encircle the active area is formed during the polysilicon etch step. A gate bus 71 is attached to plate 70 which plate is continuous with the full polysilicon gate area in the active device. Polysilicon rings 80, 81 and 82 can be also formed during the polysilicon etch step for the active device. P type rings 90 to 93 are diffused during the step of FIG. 3 and are defined by polysilicon patterns 70, 80, 81 and 82. Small contacts, schematically shown by dotted lines 95, 96 and 97 connect P regions 90, 91 and 92 to gates 80, 81 and 82 of the 3 PMOS devices shown, shorting the source and gate electrodes of each PMOS device. Thus, the threshold voltages of the 3 PMOS devices are connected in series to terminate the device. Any desired number of PMOS devices can be used, as required by the voltage to be terminated.

Figure 8:
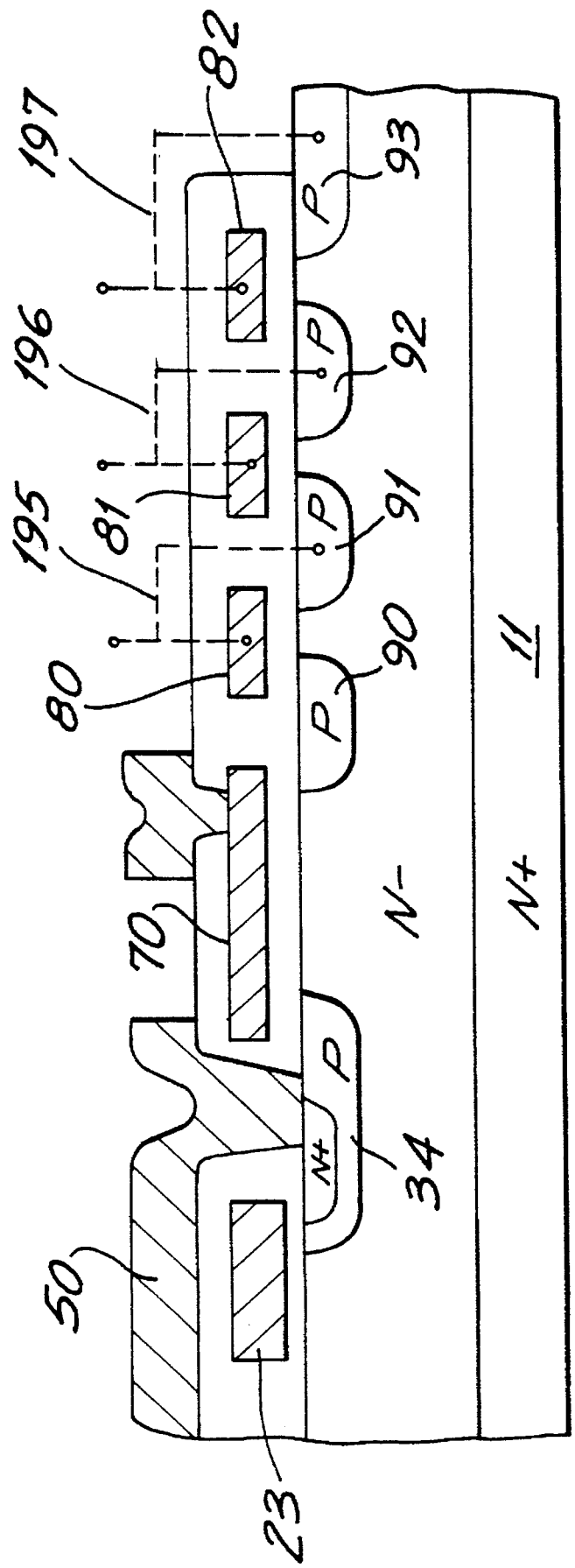
FIG. 8 shows the use of floating-field rings with field plates as a termination for the device disclosed.

The arrangement of FIG. 7 shows a termination structure in which the rings or strips 90, 91 and 92 are shorted to limit voltage to the device threshold voltages. FIG. 8 shows another termination structure in which each of polysilicon rings 80, 81 and 82 is shorted to the next P ring 91, 92 and 93 respectively to its right, limiting the voltage to the punch-through voltage between P rings and biasing the PMOS devices off. Small contacts, schematically shown in FIG. 8 by dotted lines 195, 196 and 197, connect P regions 91, 92 and 93 to polysilicon field rings 80, 81 and 82. A combination of the above two termination structures can also be used.

The shorting contacts used are preferably only sparsely spaced around the rings and the contact positions are defined during the contact opening mask step. Thus, small area contacts 95, 96 and 97 may be located in a corner of a rectangular chip. The small area contacts 95, 96 and 97 may be separated from the source metal during the metal mask step.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for the manufacture of a MOS gated semiconductor device, comprising the steps of:

(a) forming an insulation layer atop a major surface of a silicon wafer;

(b) patterning said insulation layer in a first mask step to define at least a first area which is thicker than at least a second second area adjacent to said first area;

(c) depositing a layer of polysilicon atop said insulation layer and patterning said polysilicon layer in a second masking step to cover and mask a third area and to expose a fourth area of said second area;

(d) implanting first species atoms at an energy sufficient to penetrate both said first and second insulation areas and diffusing said implanted first species atom to form at least one base region in said silicon wafer in an area exposed by said patterned polysilicon;

(e) implanting second species atoms at an energy sufficient to penetrate said second insulation area but insufficient to penetrate said first insulation area, thereby to form at least one source region in said at least one base region;

(f) and thereafter forming a source contact which contacts said at least one source region and at least one base region.

2. The process of claim 1 in which said insulation layer is silicon dioxide.

3. The process of claim 1 in which a plurality of adjacent first and second areas are formed in said insulation layer, thereby to ultimately define a plurality of adjacent respective base regions and source regions.

4. The process of claim 1 wherein said first area has a thickness of approximately 2500 Å and said second area has a thickness of less than about 1000 Å.

5. The process of claim 1 in which said first species is boron and said second species is arsenic.

6. The process of claim 5 wherein said insulation layer is silicon dioxide and wherein said first area has a thickness of approximately 2500 Å and said second area has a thickness of less than about 1000 Å.

7. The process of claim 6 wherein the energy of implantation of said boron is greater than about 80 KeV and the energy of implantation of said arsenic is less than about 80 KeV.

8. The process of claim 6 in which a plurality of adjacent first and second areas are formed in said insulation layer, thereby to define a plurality of adjacent respective base regions and source regions.

9. The process of claim 8 wherein the energy of implantation of said boron is greater than about 80 KeV and the energy of implantation of said arsenic is less than about 80 KeV.

10. The process of claim 1 which further includes the step of depositing and patterning a layer of low temperature oxide after step (e) in an alignment mask step to expose at least portions of said base and source regions prior to forming said source contact.

11. The process of claim 6 which further includes the step of depositing and patterning a layer of low temperature oxide after step (e) in an alignment mask step to expose at least portions of said base and source regions prior to forming said source contact.

12. The process of claim 11 wherein the energy of implantation of said boron is greater than about 80 KeV and the energy of implantation of said arsenic is less than about 80 KeV.

13. The process of claim 1 wherein a portion of said polysilicon patterned layer overlies a portion of said first area to expose a further area of said first area to define at least one guard ring diffusion in said silicon surface during the formation of said base region.

14. The process of claim 6 wherein a portion of said polysilicon patterned layer overlies a portion of said first area to expose a further area of said first area to define at least one guard ring diffusion in said silicon surface during the formation of said base region.

15. The process of claim 14 wherein the energy of implantation of said boron is greater than about 80 KeV and the energy of implantation of said arsenic is less than about 120 KeV.

* * * * *